(12) United States Patent
Yan et al.

(10) Patent No.: US 10,706,199 B1
(45) Date of Patent: Jul. 7, 2020

(54) GRAPHICAL USER INTERFACE FOR INTERACTIVE MACRO-CELL PLACEMENT

(71) Applicant: Cadence Design Systems, Inc., San Jose, CA (US)

(72) Inventors: Jackey Z. Yan, Sunnyvale, CA (US); Cindy Zhang, Pudong District (CN); Pinhong Chen, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 197 days.

(21) Appl. No.: 15/979,171

(22) Filed: May 14, 2018

(51) Int. Cl.
*G06F 30/00* (2020.01)
*G06F 30/392* (2020.01)
*H04W 16/32* (2009.01)
*G06F 3/0484* (2013.01)

(52) U.S. Cl.
CPC ........ *G06F 30/392* (2020.01); *G06F 3/04842* (2013.01); *H04W 16/32* (2013.01)

(58) Field of Classification Search
CPC .............................. G06F 30/394; G06F 30/398
USPC ......................................................... 716/119
See application file for complete search history.

(56) References Cited

U.S. PATENT DOCUMENTS

| | | | | |
|---|---|---|---|---|
| 5,781,446 A * | 7/1998 | Wu | ....................... | G06F 30/392 716/122 |
| 5,914,887 A * | 6/1999 | Scepanovic | ........... | G06F 30/392 716/123 |
| 6,272,668 B1 * | 8/2001 | Teene | ..................... | G06F 30/327 716/113 |
| 6,718,520 B1 * | 4/2004 | Merryman | .............. | G06F 30/30 716/102 |
| 7,966,588 B1 * | 6/2011 | Perry | ..................... | G06F 30/367 716/100 |
| 10,176,288 B1 * | 1/2019 | Carlson | ................. | G06F 30/398 |
| 10,606,974 B1 * | 3/2020 | Acharya | ............... | G06F 30/392 |
| 2008/0016476 A1 * | 1/2008 | Chan | ....................... | G06F 30/39 716/122 |
| 2013/0167103 A1 * | 6/2013 | Burrell | .................... | G06F 30/23 716/136 |
| 2015/0227670 A1 * | 8/2015 | Gordon | ................. | G06F 30/398 716/52 |

* cited by examiner

*Primary Examiner* — Suchin Parihar
(74) *Attorney, Agent, or Firm* — Schwegman Lundberg & Woessner, P.A.

(57) ABSTRACT

Aspects of the present disclosure address systems, methods, and an improved graphical user interface (GUI) for providing interactive macro-cell placement for integrated circuit (IC) design. The method includes causing display of a GUI that includes a display of an IC floor plan comprising multiple macro-cells, The method further includes receiving a user selection of two or more macro-cells from the IC floor plan, and updating the GUI to display layout options for the two or more macro-cells in conjunction with the display of the IC floor plan. Each layout option specifies an arrangement of the two or more macro-cells. In response to a user selection of a layout option, the display of the IC floor plan is updated by modifying a placement of the two or more macro-cells in accordance with the selected layout option.

20 Claims, 11 Drawing Sheets

GRAPHICAL USER INTERFACE FOR INTERACTIVE MACRO-CELL PLACEMENT

TECHNICAL FIELD

The present disclosure generally relates to the technical field of integrated circuit design. In particular, the present disclosure addresses systems, methods, and graphical user interfaces for interactive macro-cell placement.

BACKGROUND

An integrated circuit (IC) comprises cells of similar and/or various sizes, and connections between the cells. A cell may include several pins interconnected by wires to pins of one or more other cells, An IC may comprise both standard cells and macro-cells (also referred to simply as "macros"). Sizes of typical macro-cells are much larger than the sizes of standard cells. Further, macro-cells may be viewed as "black boxes," as the logic and electronic behavior of macro-cells are known, but the inside structural description may not be known Design engineers design ICs by transforming circuit description of the ICs into geometric descriptions, called layouts. To create layouts, design engineers typically use electronic design automation (EDA) applications. These applications provide sets of computer-based tools for creating, editing, and analyzing design layouts.

EDA applications create layouts by using geometric shapes that represent different materials and devices on ICs. For instance, EDA tools commonly use rectangular lines to represent the wire segments that interconnect the IC components. These tools also represent electronic and circuit IC components as geometric objects with varying shapes and sizes. For example, macro-cells are typically represented using rectangular blocks of varying sizes.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules (e.g., macro-cells); (3) placement, which determines more precisely the positions of the circuit components; (4) routing, which completes the interconnects between the circuit components; and (5) verification, which checks the layout to ensure that it meets design and functional requirements.

During floor planning and placement, cells are placed within a layout area to optimize certain objectives such as total wire length. Standard cells often have the same height and need to be placed in specified rows. Macro-cell placement, on the other hand, is more flexible than standard cell placement because the locations of macro-cells are not restricted and the dimensions of macro-cells vary.

Conventional EDA applications provide graphical user interfaces (GUIs) that enable users to perform floor planning and placement in preparation of IC design layouts. The GUIs of conventional EDA applications often require users to manually place each macro-cell one by one within the layout area. However, there are two main problems with the manual approach.

First, the process is slow and inefficient. As the design becomes bigger and bigger, there may be thousands of macro-cells. Manually placing them one by one could take a significant amount of time.

Second, users may he unable to determine the best layout solution among a number of macro-cells, especially when the number of macros is more than four and each macro has a different size or shape. The layout solution space may be too large to explore manually.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
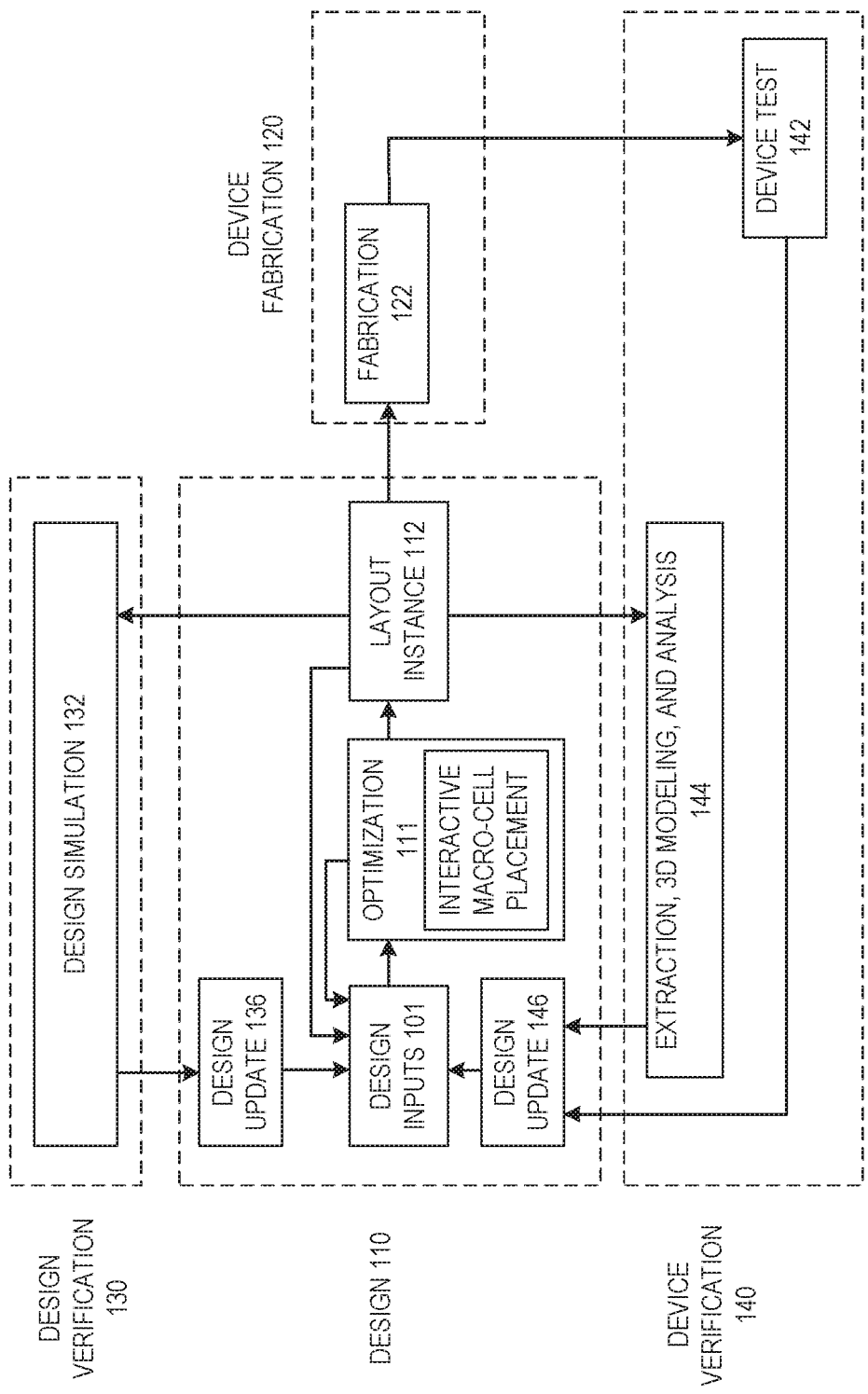
FIG. 1 is a diagram illustrating a possible design process flow for generating a circuit using interactive placement of macro-cells, according to some example embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure address systems, methods, and an improved graphical user interface (GUI) for providing interactive macro-cell placement for integrated circuit (IC) design. Consistent with some embodiments, the system includes a GUI that includes a display of an IC floor plan comprising multiple macro-cells. The system receives a user selection, via the GUI, of a grouping of two or more macro-cells from the IC floor plan. In response to receiving the user selection, the system determines, in a background process, multiple layout options for the grouping of macro-cells, and updates the GUI to display the multiple layout options in conjunction with the display of the IC floor plan. Each layout option specifies an arrangement of the two or more macro-cells that includes a relative position and orientation of each macro-cell. The layout options presented for selection may be a subset of possible layout options for the grouping of macro-cells selected based on or optimized according to one or more constraints for the IC design (e.g., a minimum or maximum wire length, dead space, or timing).

The multiple layout options may be presented in a window within the GUI in conjunction with the IC floor plan. In some embodiments, the window may include a curve plotted along with the layout options that serves as an interactive navigation object that allows a user to quickly view multiple layout options and select one for use in the IC floor plan. The layout options displayed along with the curve may be overlaid upon one another. By displaying the layout options in such a compacted manner, the GUI is able to display more layout options to the user than if the layout options were individually displayed within their own portion of the window.

In response to receiving a user selection of a layout option from among the multiple layout options, the system updates the display of the IC floor plan within the GUI by modifying the placement of the two or more macro-cells in accordance with the selected layout option. The modifying of the placement of the two or more macro-cells may include modifying a position and/or orientation of one or more macro-cells in the selected grouping.

By providing layout options for a selected grouping of macro-cells for user selection, the GUI described herein improves upon GUIs provided by prior EDA applications by eliminating the need for the user to manually place macro-cells one by one, thereby decreasing the amount of time taken by the floor planning and placement processes. Additionally, because the layout options presented to the user are optimized according to the design constraints, the enhanced IC designs that result from use of the GUI and underlying system are improved compared to those of prior EDA applications that require manual placement.

FIG. 1 is a diagram illustrating a possible design process flow 100 for generating a circuit using interactive placement of macro-cells, according to some example embodiments. It will be apparent that the interactive macro-cell placement techniques as described herein may be used with other design flows, but the design process flow 100 is described here for the purposes of illustration. As illustrated, the overall design process flow 100 includes a design phase 110, a device fabrication phase 120, a design verification phase 130, and a device verification phase 140. The design phase 110 involves an initial design input operation 101 where the basic elements and functionality of a device are determined, as well as revisions based on various analyses and optimization of a circuit design. The initial strategy, tactics, and context for the device to be created are also generated in the design input operation 101, depending on the particular design algorithm to be used.

Following an initial selection of design values in the design input operation 101, interactive macro-cell placement occurs at an optimization operation 111, along with any other automated design processes. As described below, as part of the interactive macro-cell placement, a GUI may be provided to display an IC floor plan that comprises multiple macro-cells. Each macro-cell may be selected by a user for automatic placement within the floor plan. For example, upon receiving a selection of a grouping of macro-cells (e.g., two or more macro-cells) from the floor plan, the GUI may be updated to present multiple layout options for arranging the selected macro-cells. In response to receiving user selection of one of the multiple layout options, the floor plan is updated by modifying the placement of the macro-cells in accordance with the selected layout option.

After design inputs are used in the design input operation 101 to generate a circuit layout, and any optimization operations 111 are performed, a layout is generated in a layout instance 112. The layout describes the physical layout dimensions of the device that match the design inputs. This layout may then be used in a device fabrication operation 122. to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, design updates 136 from design simulation 132 operations; design updates 146 from device test 142 or extraction, 3D modeling, and analysis 144 operations; or direct design input operations 101 may occur after an initial layout instance 112 is generated. In various embodiments, whenever design inputs are used to update or change an aspect of a circuit design, an optimization operation 111 may be performed.

Figure 2:
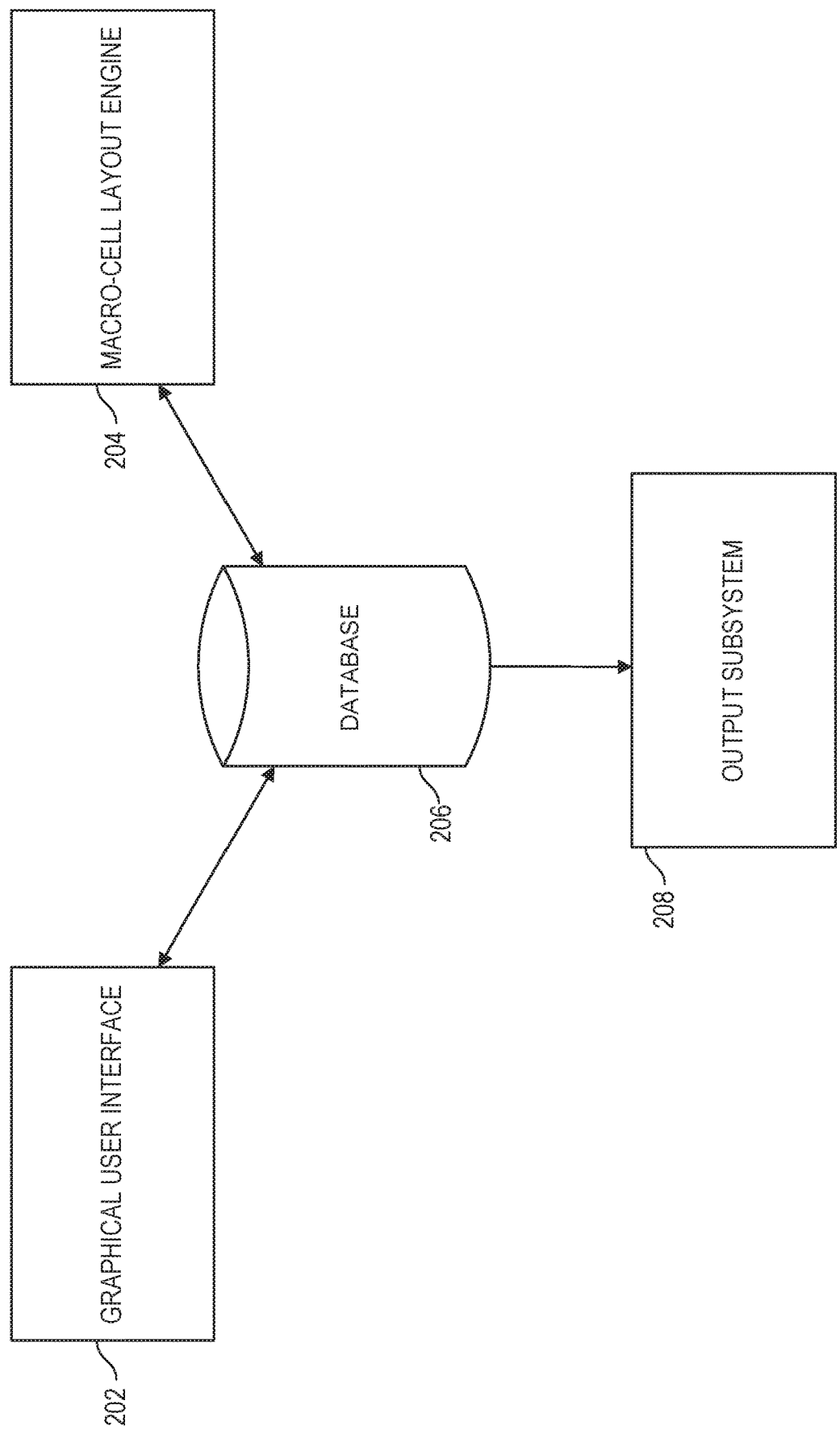
FIG. 2 is a block diagram illustrating a macro-cell placement system, according to some example embodiments.

With reference to FIG. 2, a macro-cell placement system 200, which may be used in the context of the interactive macro-cell placement of the optimization operation 111 of the design process flow 100, is illustrated, according to some example embodiments. The macro-cell placement system 200 comprises a graphical user interface (GUI) 202; a database 206; a macro-cell layout engine 204; and an output subsystem 208. To avoid obscuring the inventive subject matter with unnecessary detail, various functional components that are not germane to conveying an understanding of the inventive subject matter have been omitted from FIG. 2. However, a skilled artisan will readily recognize that various additional functional components may be supported by the macro-cell placement system 200 to facilitate additional functionality that is not specifically described herein.

Any one or more of the functional components illustrated in FIG. 2 and described herein may be implemented using hardware (e.g., a processor of a machine) or a combination of hardware and software. For example, any one of the components described herein may configure a processor to perform the operations described herein for that component. Moreover, any two or more of these components may be combined into a single component, and the functions described herein for a single component may be subdivided among multiple components. Furthermore, according to various example embodiments, any of the functional components illustrated in FIG. 2 may be implemented together or separately within a single machine, database, or device or may be distributed across multiple machines, databases, or devices.

The GUI 202 is responsible for displaying information to a user and handling user interactions with the macro-cell placement system 200. For example, the GUI 202 may allow a user to view and edit an IC floor plan. The GUI 202 may also include one or more elements that facilitate interactive macro-cell placement within an IC floor plan. More specifically, the GUI 202 may allow a user to select a grouping of macro-cells from the IC floor plan, and in response to the user selection, the GUI 202 may display multiple layout options for the selected grouping. In response to user selection of one of the multiple layout options, the IC floor plan displayed within the GUI 202 is updated by modifying the placement of the grouping of macro-cells in accordance with the selected layout option.

The database 206 stores IC design information including design constraints in a compact and efficient manner. The output subsystem 208 outputs resulting IC floor plans and other useful information into files of standard and/or custom format.

The macro-cell layout engine 204 determines layout options for selected groupings of macro-cells in a background process. The macro-cell layout engine 204 may employ one of many known or proprietary techniques or algorithms to determine layout options for the selected groupings. The layout options provided by the macro-cell layout engine 204 may be optimized for design constraints. For example, the macro-cell layout engine 204 may initially determine every possible layout for a given selected grouping of macro-cells, rank each possible layout according to a degree of conformance with design constraints, and select a subset of the possible layouts as the layout options based on the rank of each layout.

Figure 3:
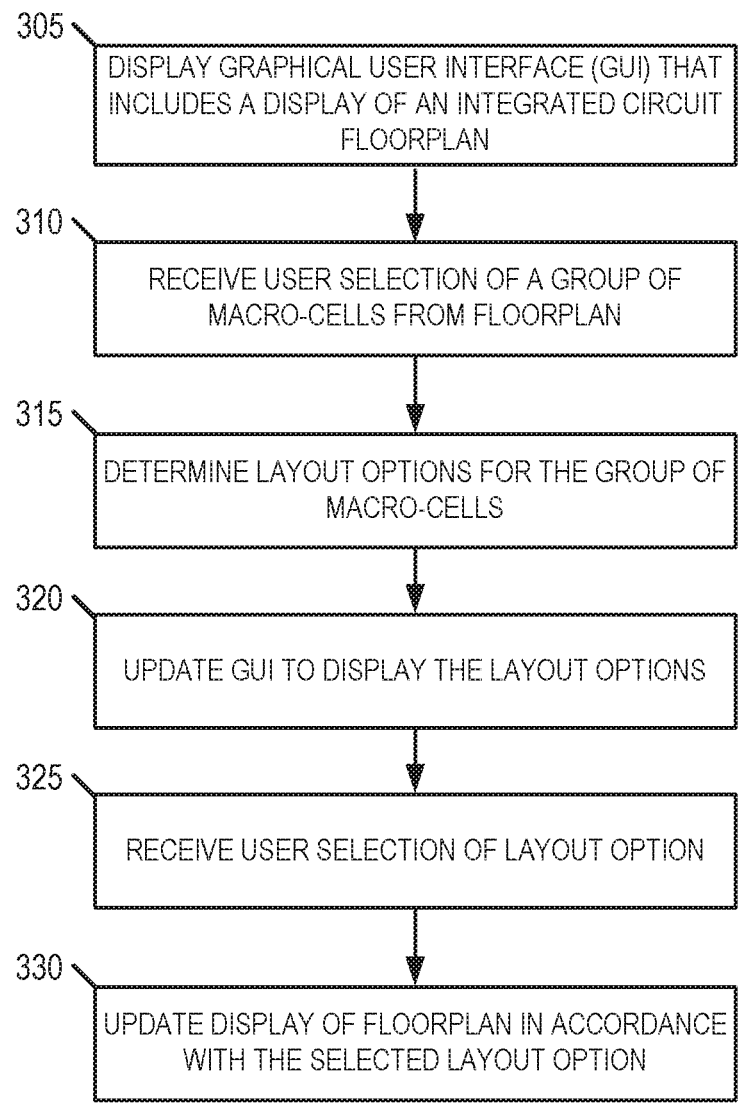
FIGS. 3-5 are flowcharts illustrating operations of the macro-cell placement system in performing a method for interactive placement of macro-cells in an IC floor plan, according to some example embodiments.
Figure 4:
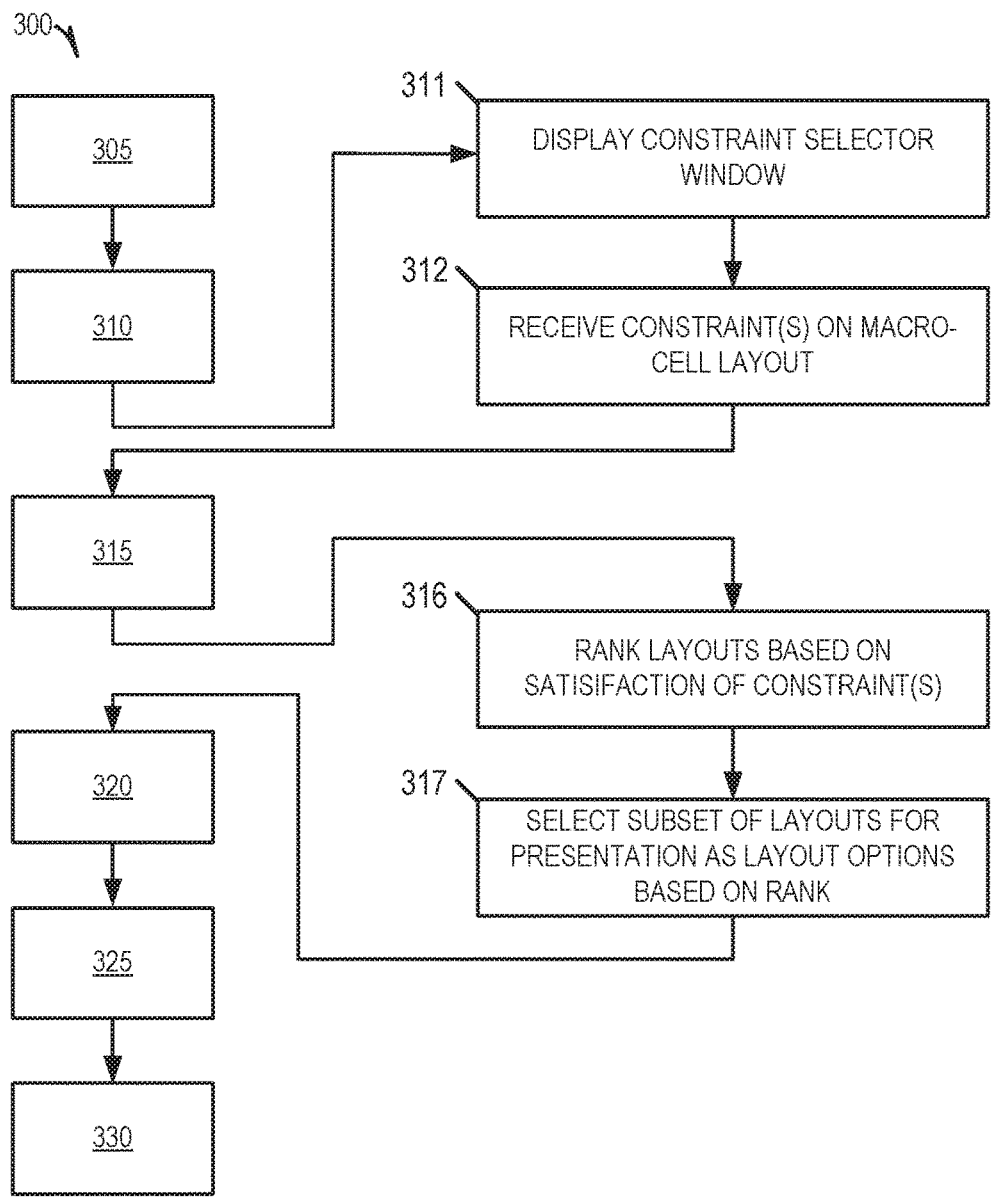
Figure 5:
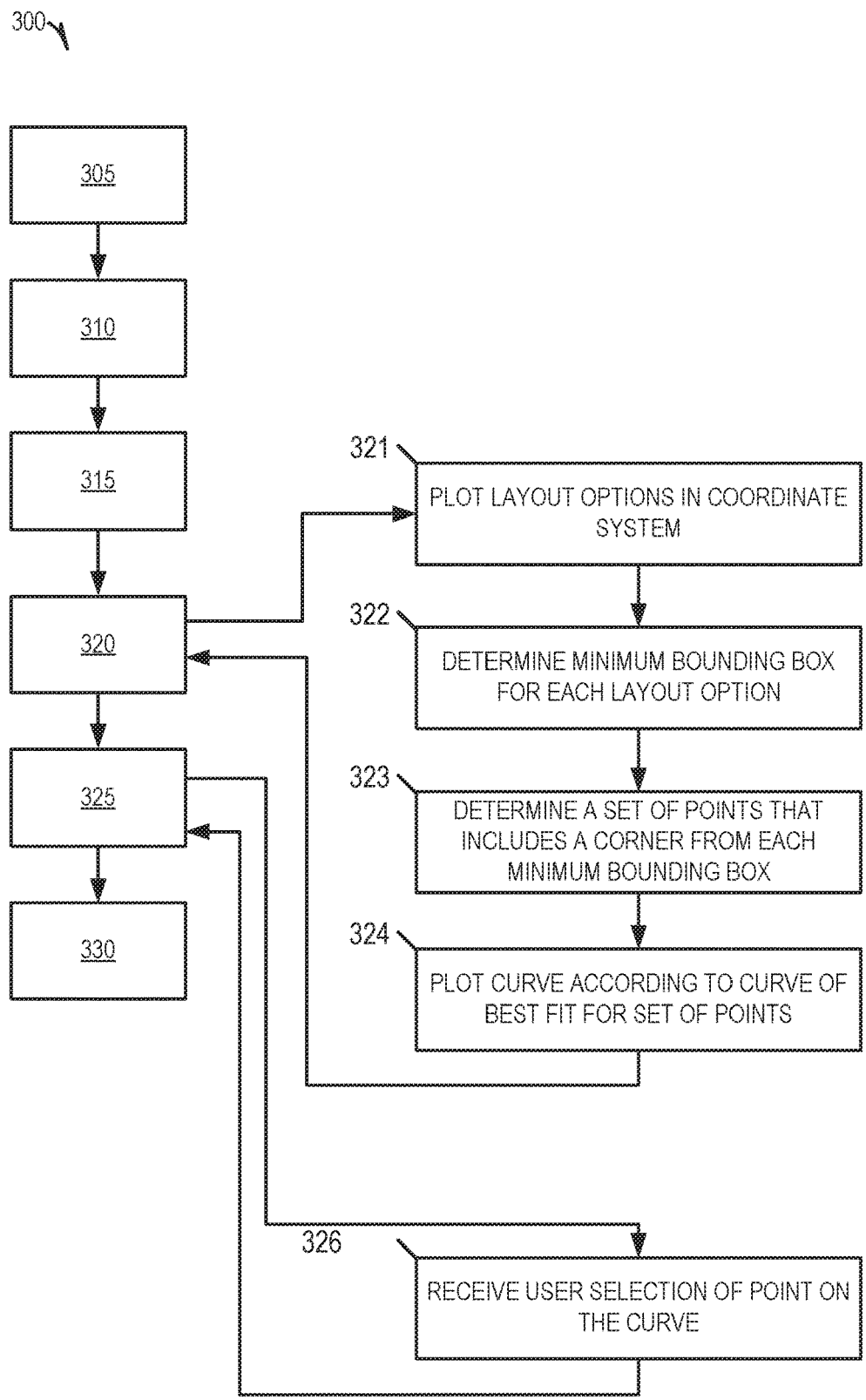

FIGS. 3-5 are flowcharts illustrating operations of the macro-cell placement system 200 in performing a method 300 for interactive placement of macro-cells in an IC floor plan, according to some example embodiments. The method 300 may be embodied in computer-readable instructions for execution by one or more processors such that the operations of the method 300 may be performed in part or in whole by the macro-cell placement system 200; accordingly, the method 300 is described below by way of example with reference thereto. However, it shall be appreciated that at least some of the operations of the method 300 may be deployed on various other hardware configurations, and the method 300 is not intended to be limited to the macro-cell placement system 200.

At operation 305, the macro-cell placement system 200 causes display, on a display device in communication with a computer system, of the GUI 202 that includes a display of an IC floor plan. The computer system may, for example, be configured (e.g., by software comprising a set of computer-readable instructions) to include one or more components of the macro-cell placement system 200. The IC floor plan comprises multiple macro-cells. Each macro-cell corresponds to an IC component and may be represented in the display of the IC floor plan by a geometric object such as a block. Further, the geometric objects included in the display of the IC floor plan may be of various different sizes and dimensions that approximate the relative sizes of the corresponding macro-cells.

The macro-cell placement system 200 receives, via the GUI 202, a user selection of a grouping of two or more macro-cells from the IC floor plan, at operation 310. For example, a user may use an input device (e.g., a mouse) of the computer system to individually select each macro-cell in the grouping or may use the input device to trace a box or other selection around the grouping of macro-cells.

The macro-cell layout engine 204, at operation 315, determines multiple layout options for the selected grouping of two or more macro-cells. Each layout option specifies an arrangement for the grouping including a relative position and orientation of each macro-cell in the grouping. Accordingly, the macro-cell layout engine 204 may employ a macro-packing algorithm to determine multiple combinations of positions and orientations for the grouping of macro-cells. For example, the macro-cell layout engine 204 may determine every possible combination of position and orientation for each macro-cell to determine the layout options for the grouping based on the geometry of each of the macro-cells.

In some embodiments, the macro-cell layout engine 204 may determine multiple layout options for the selected grouping that satisfy one or more user constraints. In other embodiments, the macro-cell layout engine 204 may determine every possible layout for the grouping of macro-cells, rank each layout according to satisfaction of user constraints, and select a subset of the possible layouts as the layout options.

At operation 320, the macro-cell placement system 200 updates the GUI 202 to display the multiple layout options for the grouping of macro-cells in conjunction with a display of the IC floor plan. From the user's perspective, the GUI 202 is updated in response to selection of the grouping of macro-cells.

The updating of the GUI 202 may include causing display, within the GUI 202, of a window to present the multiple layout options. As noted above, each layout option specifies an arrangement of the macro-cells in the grouping, and thus the presentation of each layout option includes a display of the arrangement of the macro-cells in the grouping.

In some embodiments, the window may be segmented into multiple portions, each of which presents a layout option. In other embodiments, the window includes a curve plotted over the layout options, where each layout option is represented as a point on the curve and the layout options are displayed overlaid upon one another. Further details regarding the display of the layout options are illustrated in FIGS. 6A-C, 7A, and 7B, and discussed below in reference thereto.

The macro-cell placement system 200 receives, via the GUI 202, a user selection of a layout option from the multiple layout options, at operation 325. For example, a user may use an input device (e.g., a mouse) to select a layout option from the presentation of multiple layout options. In embodiments in which the layout options are presented within a window that includes a curve plotted along with the layout options, the receiving of the user selection may include receiving a selection of a point on the curve.

In response to receiving the user selection, the macro-cell placement system 200 updates the display of the floor plan within the GUI 202 in accordance with the selected layout option, at operation 330. The updating of the floor plan includes modifying the placement of the grouping of macro-cells in accordance with the arrangement of the macro-cells specified by the selected layout option. More specifically, the updating of the floor plan may include modifying a position and orientation of one or more macro-cells in the grouping according to the position and orientation of the one or more macro-cells specified by the selected layout option.

As shown in FIG. 4, the method 300 may, in some embodiments, include operations 311, 312, 316, and 317. At operation 311, the macro-cell placement system 200 causes display of a constraint selector window within the GUI 202 displayed on the display device in communication with the computer system. The constraint selector window enables a user to specify one or more constraints for arranging macro-cells. The constraints may, for example, include a minimum or maximum wire length, dead space percentage, or timing. Accordingly, the constraint selector window may include interactive elements (e.g., buttons, sliders, dials, etc.) that enable a user to specify values to constrain wire length, dead space percentage, or timing of macro-cell layout options.

As shown, the operations 311 and 312 may, in some embodiments, be performed subsequent to operation 310 where the macro-cell placement system 200 receives the user selection of the grouping of the two or more macro-cells in the IC floor plan. Accordingly, the macro-cell placement system 200 may cause display of the constraint selector window in response to user selection of the grouping of the two or more macro-cells. However, the operation 311 is not limited to being performed subsequent to the operation 310 and may, for example, instead be performed subsequent to the operation 305 where the macro-cell placement system 200 causes display of the GUI 202. Accordingly, the constraint selector window may be displayed in response to user selection of a corresponding interactive element (e.g., button) presented within the GUI 202 prior to the user selection of the grouping of macro-cells.

At operation 312, the macro-cell placement system 200 receives one or more constraints specified by the user using the constraint selector window. As noted above, the constraints specified by the user may include at least one of a minimum or maximum wire length, dead space percentage, or timing.

The operations 316 and 317 may, in some embodiments, be performed subsequent to or as part (e.g., as a subroutine or precursor task) of the operation 315 where the macro-cell placement system 200 determines multiple layout options for the grouping of the two or more macro-cells. As noted above, in some embodiments, in determining the layout options for the grouping, the macro-cell placement system 200 may determine every possible layout of the grouping of macro-cells. Consistent with these embodiments, the macro-cell placement system 200, at operation 316, ranks the layouts based on the degree to which each layout satisfies the one or more constraints received at operation 312. At operation 317, the macro-cell placement system 200 selects a subset of the possible layouts for presentation as the layout options based on the rank of each layout.

As shown in FIG. 5, the method 300 may, in some embodiments, include operations 321-324 and 326. The operations 321-324 may, in some embodiments, be performed as part (e.g., as a subroutine or precursor task) of the operation 320 where the macro-cell placement system 200 updates the GUI 202 to display layout options in conjunction with the IC floor plan.

At operation 321, the macro-cell placement system 200 plots the layout options for the grouping of macro-cells in a coordinate system. For example, the macro-cell placement system 200 may plot the layout options within a Cartesian coordinate system that includes a vertical (Y) axis and a horizontal (X) axis. The macro-cell placement system 200 may plot the layout options such that the layout options are overlaid on one another.

The macro-cell placement system 200, at operation 322, computes a minimum bounding box for each layout option. Each minimum bounding box is the smallest box in terms of area that encloses each macro-cell in the layout.

The macro-cell placement system 200, at operation 323, identifies a set of points within the coordinate system that includes a corner of each minimum bounding box. For example, the macro-cell placement system 200 may identify the corner of each minimum bounding box with the maximum X and Y values in the Cartesian coordinate system.

At operation 324, the macro-cell placement system 200 plots a curve in the coordinate system according to a curve of best fit for the set of points. Accordingly, in plotting the curve, the macro-cell placement system 200 may perform one of many known curve fitting processes (e.g., interpolation, smoothing, extrapolation, etc.) on the set of points. In this manner, each layout option is represented by a point on the curve.

The operation 326 may, in some embodiments, be performed as part of the operation 325 where the macro-cell placement system 200 receives a user selection of a layout option from the presentation of multiple layout options. At operation 326, the macro-cell placement system 200 receives a user selection of a point on the curve that corresponds to a particular layout option. Upon receiving the user selection of the point, the macro-cell placement system 200 may cause the layout option to be visually distinguished from the remaining layout options in the display of layout options plotted within the coordinate system. For example, a layout option may be brought to the foreground of the display while the remaining layout options are pushed to the background. In another example, a layout option may be presented with a different (e.g., thicker) line weight than the remaining layout options. In yet another example, a layout option may be presented in a different color than the remaining layout options.

Figure 6A:
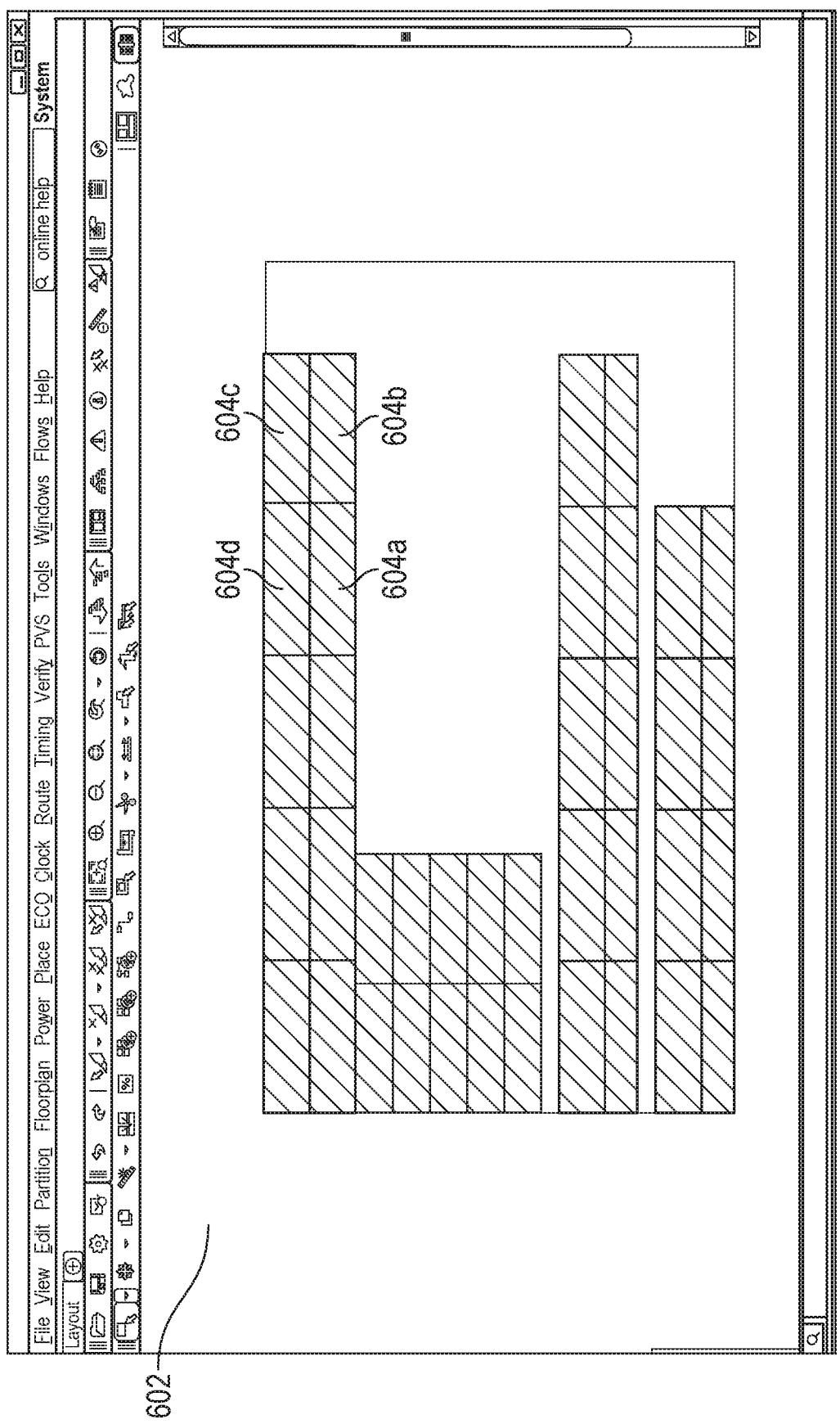
FIGS. 6A-C are interface diagrams that illustrate aspects of a graphical user interface (GUI) provided by the macro-cell placement system to provide interactive placement of macro-cells, according to some example embodiments.
Figure 6B:
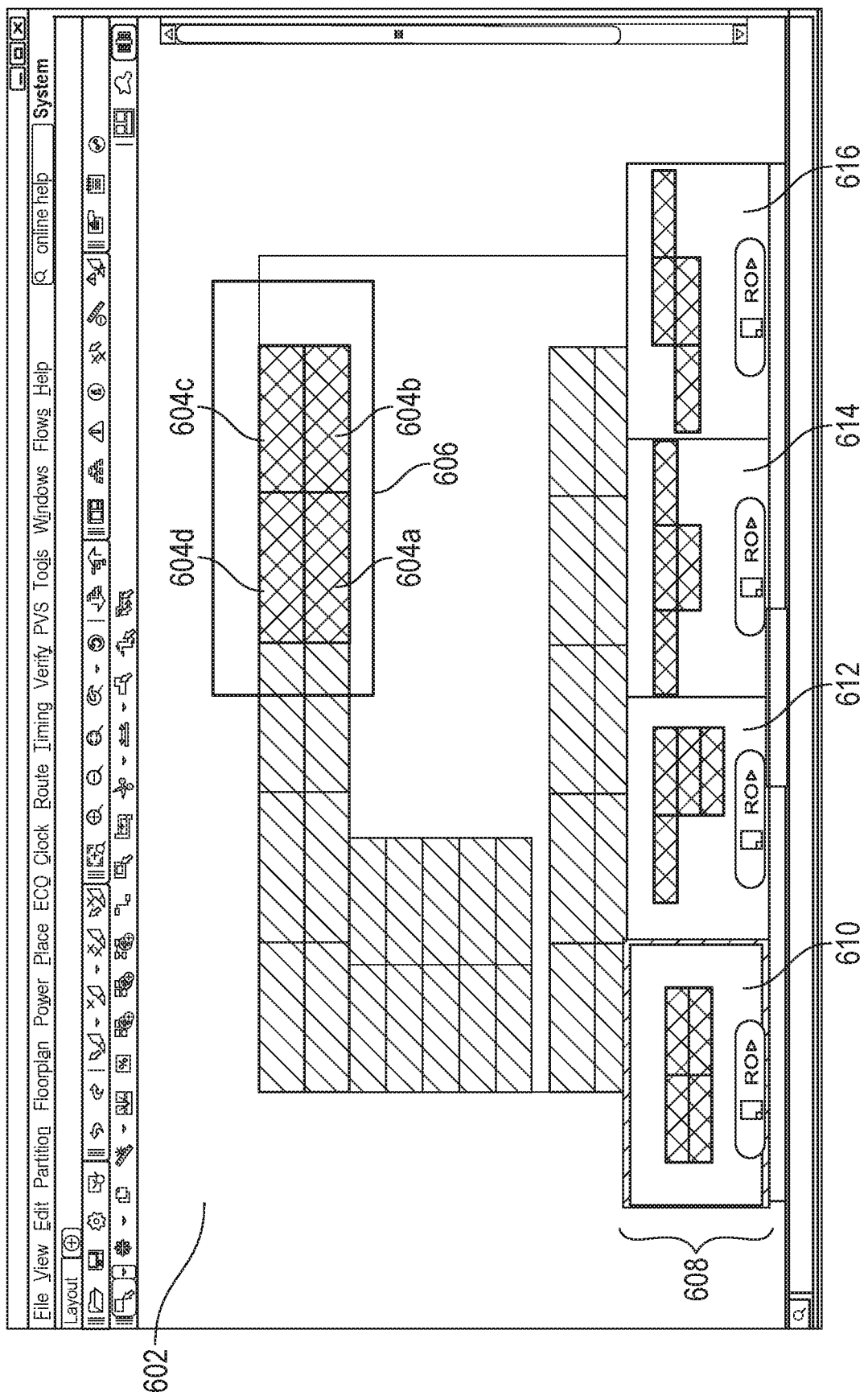
Figure 6C:
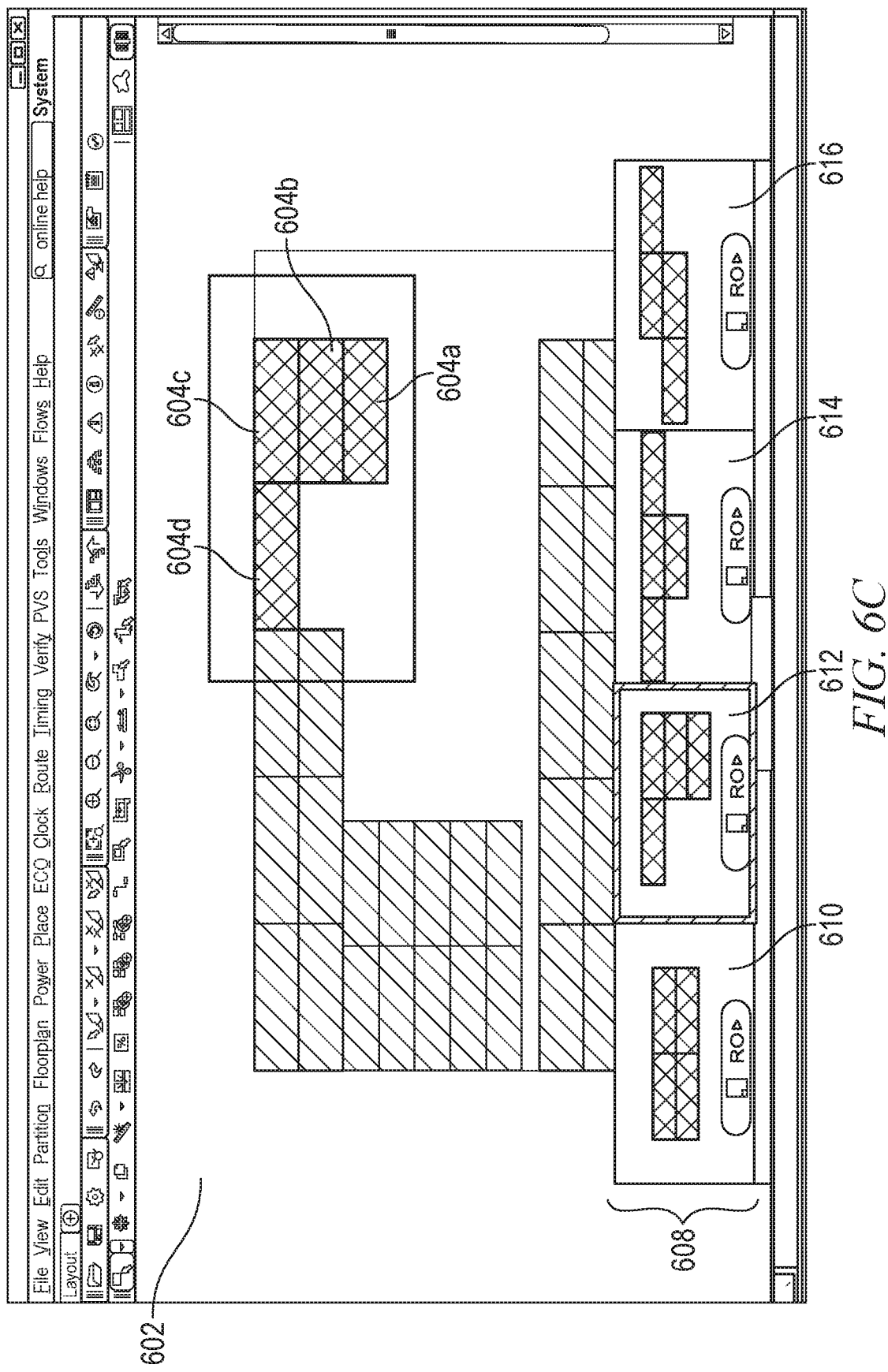

FIGS. 6A-C are interface diagrams that illustrate aspects of a GUI 600 provided by the macro-cell placement system 200 to provide interactive placement of macro-cells, according to some example embodiments. The GUI 600 is an example of the GUI 202. As shown in FIG. 6A, the GUI 600 displays an IC floor plan 602 that comprises multiple macro-cells, each of which is represented within the GUI 600 by a block. For example, the IC floor plan 602 includes macro-cells 604A-604D. Each macro-cell displayed within the IC floor plan 602 is a component of the IC being designed using the GUI 600.

FIG. 6B illustrates a user selection of the macro-cells 604A-604D. More specifically, FIG. 6B illustrates a selection box 606 being used to select the grouping of macro-cells 604A-D, although, in other embodiments, the user may select the grouping of macro-cells 604A-D by individually selecting each of the macro-cells 604A-D. In the context of FIG. 6B, the user may select the grouping of macro-cells 604A-D, for example, by using a mouse cursor to trace the selection box 606 around the grouping of macro-cells 604A-D while performing a right-click on the mouse.

In response to the user selection of the grouping of macro-cells 604A-D, the macro-cell placement system 200 causes display of a window 608 in conjunction with the display of the IC floor plan 602. As shown, the window 608 is segmented into multiple portions to present layout options 610, 612, 614, and 616 for the macro-cells 604A-D for user selection. Each of the layout options 610, 612, 614, and 616 specifies a different arrangement for the grouping of macro-cells 604A-D, where arrangement specifies different positions and orientations for the macro-cells 604A-D.

Upon receiving selection of one of the layout options 610, 612, 614, and 616, the macro-cell placement system 200 updates the display of the IC floor plan 602 in accordance with the selected layout option. The updating of the IC floor plan 602 may include modifying the placement of the grouping of the macro-cells 604A-D by modifying a position and/or orientation of any one or more of the macro-cells 604A-D within the IC floor plan 602. For example, as illustrated in FIG. 6C, in response to receiving user selection of the layout option 612, the macro-cell placement system 200 updates the placement of the macro-cells 604A-D within the IC floor plan 602 in accordance with the layout option 612. In the particular example illustrated in FIG. 6C, the updating of the placement of the macro-cells 604A-D includes modifying a position of the macro-cell 604A.

Even after the macro-cell placement system 200 updates the IC floor plan 602 in accordance with the layout option 612, the user may select any other layout options, and the macro-cell placement system 200 updates the IC floor plan 602 in accordance with the selected layout option. In this way, the user may easily change and view the changes to the IC floor plan 602 that result from selection of different layout options without having to manually move and place each macro-cell.

Figure 7A:
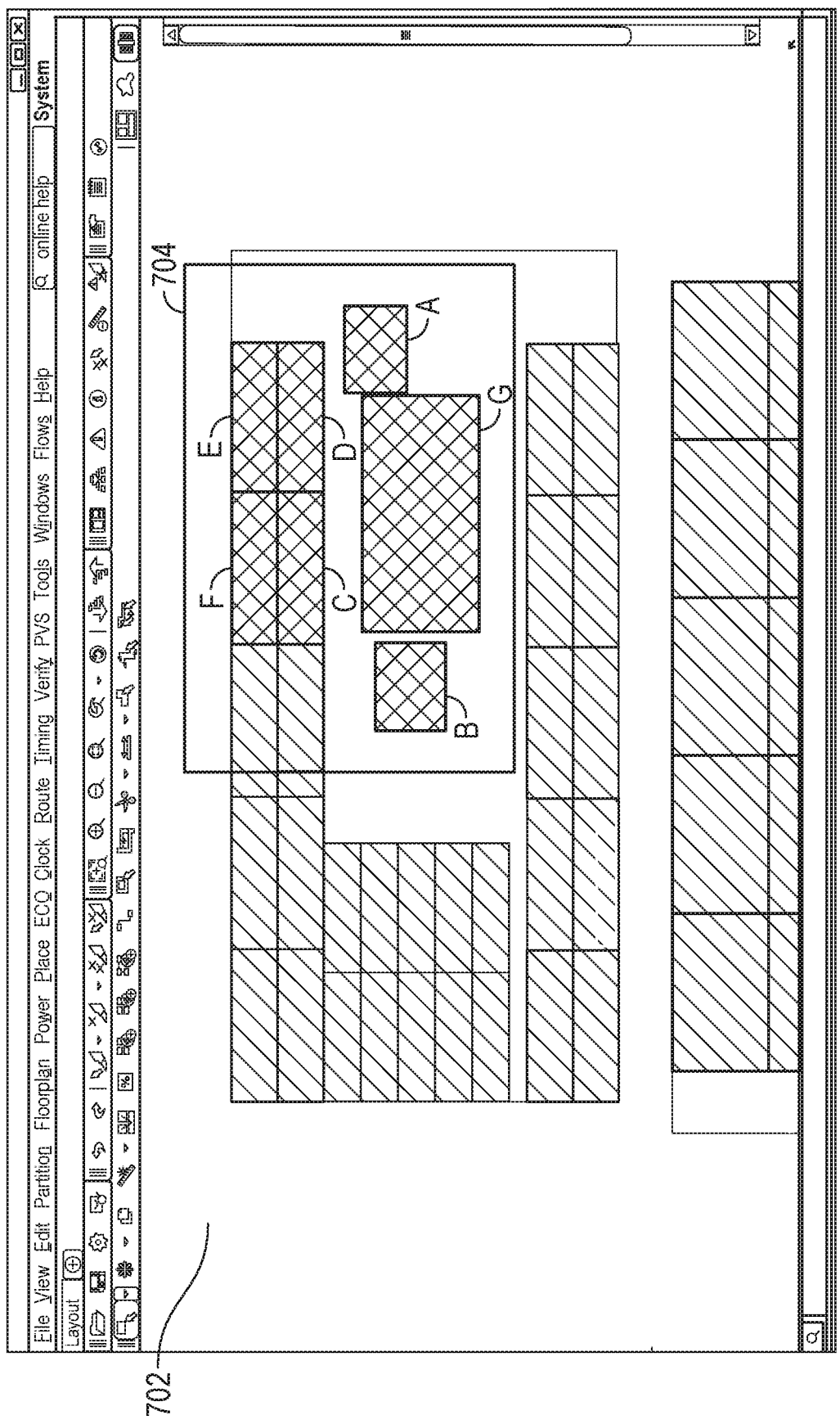
FIGS. 7A and 7B are interface diagrams that illustrate aspects of a GUI provided by the macro-cell placement system to provide interactive placement of macro-cells, according to some example embodiments.
Figure 7B:
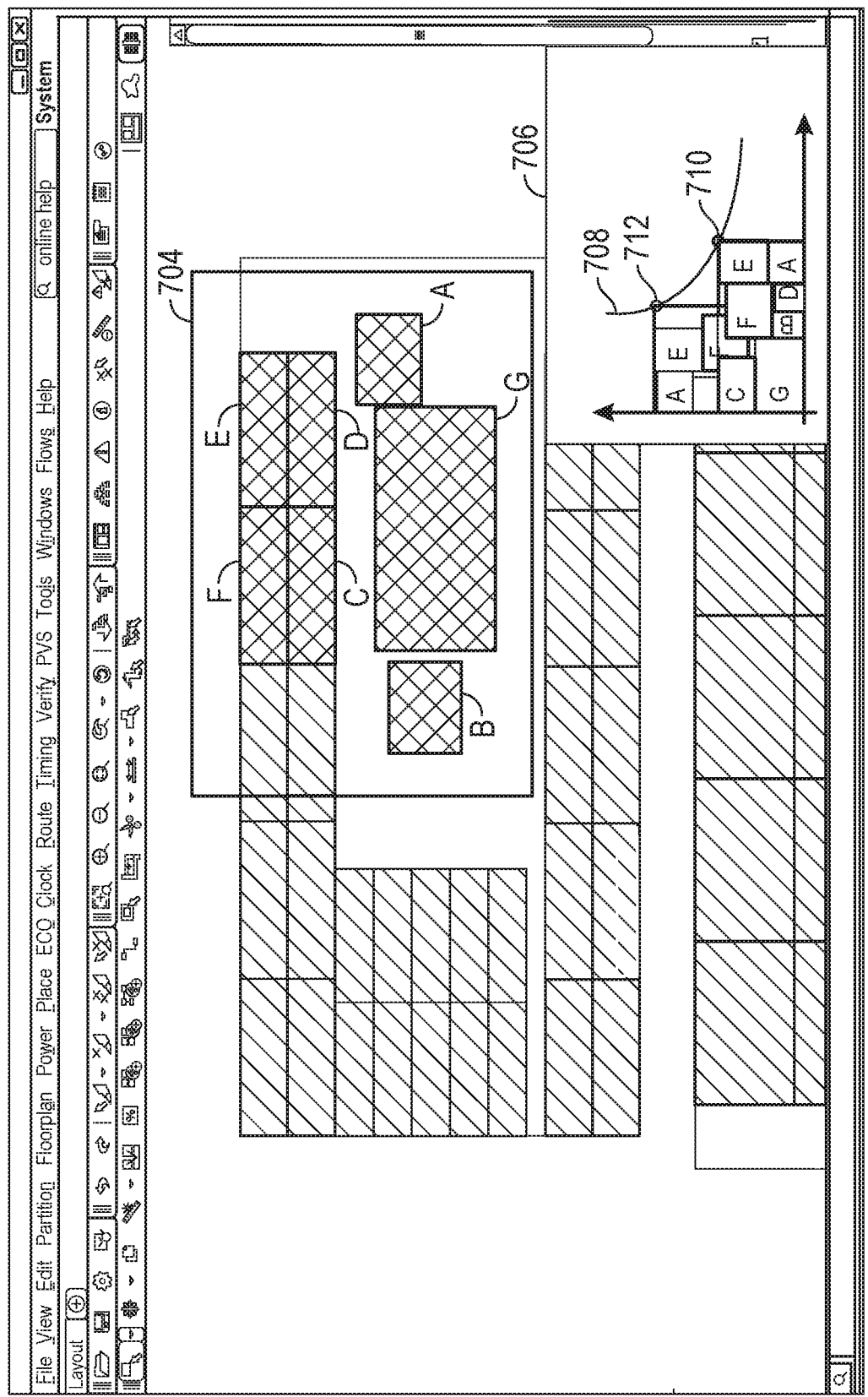

FIGS. 7A and 7B are interface diagrams that illustrate aspects of a GUI 700 provided by the macro-cell placement system 200 to provide interactive placement of macro-cells, according to some example embodiments. The GUI 700 is an example of the GUI 202. As shown in FIG. 7A, the GUI 700 displays an IC floor plan 702 that comprises multiple macro-cells, each of which is represented within the GUI 700 by a block. For example, the IC floor plan 702 includes macro-cells A-G. Each macro-cell displayed within the IC floor plan 702 is a component of the IC being designed using the GUI 700. Further, as shown in FIG. 7A, the sizes of the blocks used to represent macro-cells may vary and may be used to convey a relative size of the actual physical components to which the displayed macro-cells correspond.

FIG. 7A also illustrates a user selection of a grouping of the macro-cells A-G via a selection box 704. In response to the user selection of the macro-cells A-G, the macro-cell placement system 200 updates the GUI 700 to include a window 706, as shown in FIG. 7B. The window 706 presents multiple layout options for the grouping of the macro-cells A-G for user selection. More specifically, in the window 706, layout options 710 and 712 are plotted with reference to an origin point of a coordinate system. The layout options 710 and 712 are presented such that the layout option 712 is overlaid on the layout option 710. It shall be appreciated that in FIG. 7B only two layout options are presented for clarity and ease of explanation, but the window 706 is not limited to presentation of only two layout options, as any number of layout options may be presented for user selection. Regardless of the number of layout options presented, the layout options may be displayed overlaid upon one another to conserve screen space and maximize the number of layout options that may be presented at one time.

Further, the window 706 includes a curve 708 plotted within the coordinate system. As shown, each layout option is represented by a point on the curve 708. More specifically, point 714 corresponds to layout option 710 and point 716 corresponds to layout option 712. The points 714 and 716 correspond to corners of respective minimum bounding boxes that enclose the layout options 710 and 712. Further, the curve 708 is the resulting curve of best fit for the points 714 and 716.

The macro-cell placement system 200 may cause one of the layout options 710 or 712 to be visually distinguished (e.g., by highlighting, changing line widths, or surfacing the layout option to the foreground) in response to a user positioning a mouse cursor over the corresponding point on the curve 708. In this way, the user may be presented with several layout options within a single window, and may easily view each individual layout option without having to apply each layout option to the IC floorplan, though a user is enabled to change the layout options applied to the IC floor plan at any time.

A user may select one of the layout options 710 and 712 by selecting the corresponding point from the curve 708 (e.g., through clicking a mouse button while the mouse cursor is placed over the point). Upon receiving a user selection of one of the layout options 710 or 712, the macro-cell placement system 200 updates the IC floor plan 702 in accordance with the selected layout option in the manner described above.

ELECTRONIC APPARATUS AND SYSTEM

Example embodiments may be implemented in digital electronic circuitry, in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special-purpose logic circuitry (e.g., a field-programmable gate array (FPGA) or an application-specific integrated circuit (ASIC)).

Figure 8:
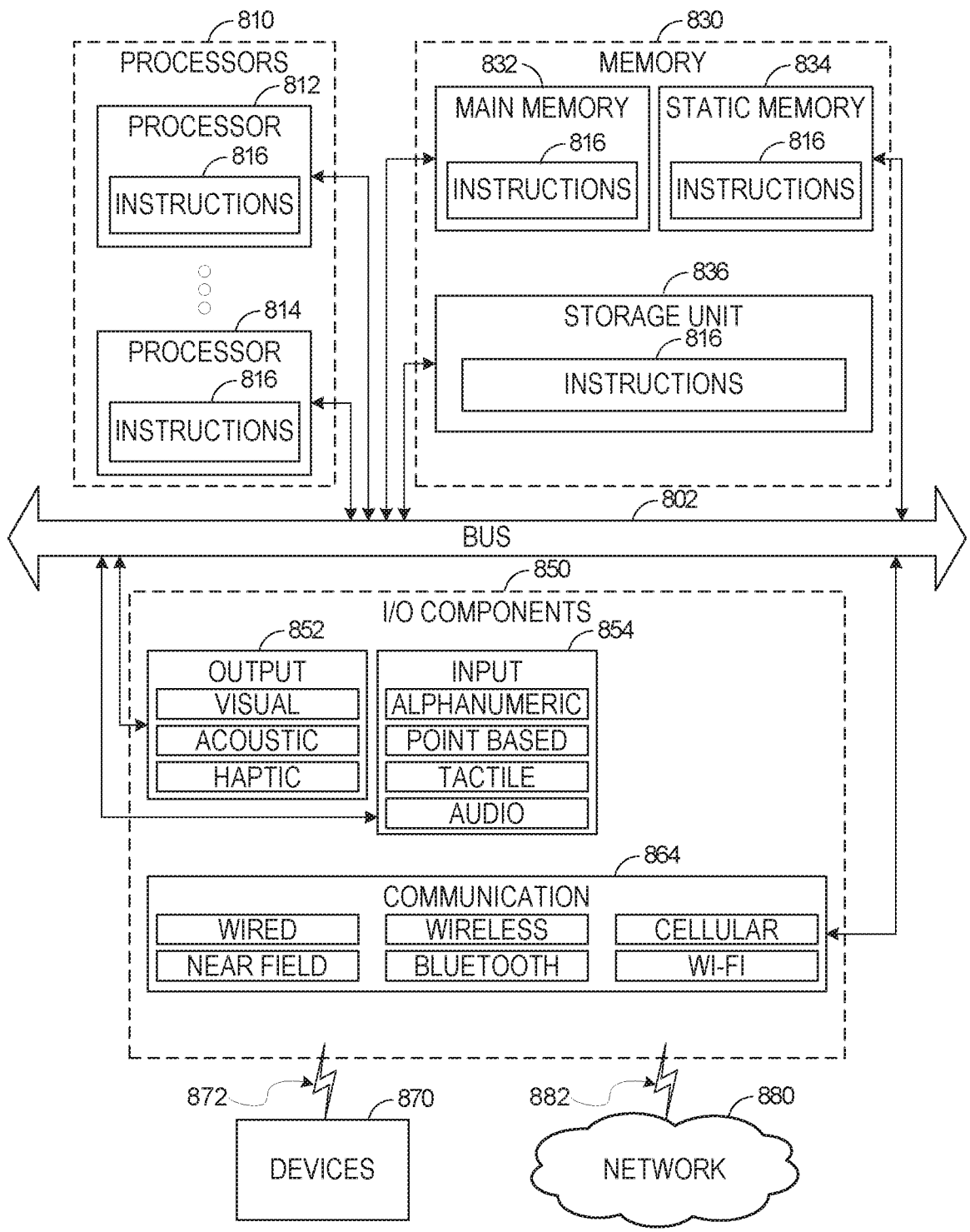
FIG. 8 is a diagrammatic representation of a machine in the example form of a computer system within which a set of instructions for causing the machine to perform any one or more of the methodologies discussed herein may be stored and executed.

FIG. 8 illustrates a diagrammatic representation of a machine 800 in the form of a computer system within which a set of instructions may be executed for causing the machine 800 to perform any one or more of the methodologies discussed herein, according to an example embodiment. Specifically, FIG. 8 shows a diagrammatic representation of the machine 800 in the example form of a computer system, within which instructions 816 (e.g., software, a program, an application, an applet, an app, or other executable code) for causing the machine 800 to perform any one or more of the methodologies discussed herein may be executed. For example, the instructions 816 may cause the machine 800 to execute the method 300. Additionally, or alternatively, the instructions 816 may implement FIGS. 1, 2, 6A-C, or 7A-B. The instructions 816 transform the general, non-programmed machine 800 into a particular machine 800, such as the macro-cell layout engine 204, programmed to carry out the described and illustrated functions in the manner described. In alternative embodiments, the machine 800 operates as a standalone device or may be coupled (e.g., networked) to other machines. In a networked deployment, the machine 800 may operate in the capacity of a server machine or a client machine in a server-client network environment, or as a peer machine in a peer-to-peer (or distributed) network environment. The machine 800 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 816, sequentially or otherwise, that specify actions to be taken by the machine 800. Further, while only a single machine 800 is illustrated, the term "machine" shall also be taken to include a collection of machines 800 that individually or jointly execute the instructions 816 to perform any one or more of the methodologies discussed herein.

The machine 800 may include processors 810, memory 830, and I/O components 850, which may be configured to communicate with each other such as via a bus 802. In an example embodiment, the processors 810 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) may include, for example, a processor 812 and a processor 814 that may execute the instructions 816. The term "processor" is intended to include multi-core processors 810 that may comprise two or more independent processors (sometimes referred to as "cores") that may execute instructions 816 contemporaneously. Although FIG. 8 shows multiple processors, the machine 800 may include a single processor with a single core, a single processor with multiple cores (e.g., a multi-core processor), multiple processors with a single core, multiple processors with multiple cores, or any combination thereof.

The memory 830 may include a main memory 832, a static memory 834, and a storage unit 836, each accessible to the processors 810 such as via the bus 802. The main memory 832, the static memory 834, and the storage unit 836 store the instructions 816 embodying any one or more of the methodologies or functions described herein. The instructions 816 may also reside, completely or partially, within the main memory 832, within the static memory 834, within the storage unit 836, within at least one of the processors 810 (e.g., within the processor's cache memory), or any suitable combination thereof, during execution thereof by the machine 800.

The I/O components 850 may include a wide variety of components to receive input, provide output, produce output, transmit information, exchange information, capture measurements, and so on. The specific I/O components 850 that are included in a particular machine will depend on the type of machine. For example, portable machines such as mobile phones will likely include a touch input device or other such input mechanisms, while a headless server machine will likely not include such a touch input device. It will be appreciated that the I/O components 850 may include many other components that are not shown in FIG. 8. The I/O components 850 are grouped according to functionality merely for simplifying the following discussion, and the grouping is in no way limiting. In various example embodiments, the I/O components 850 may include output components 852 and input components 854. The output components 852 may include visual components (e.g., a display such as a plasma display panel (PDP), a light-emitting diode (LED) display, a liquid crystal display (LCD), a projector, or a cathode ray tube (CRT)), acoustic components (e.g., speakers), other signal generators, and so forth. The input components 854 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides position and/or force of touches or touch gestures, or other tactile input components), audio input components (e.g., a microphone), and the like.

Communication may be implemented using a wide variety of technologies. The I/O components 850 may include communication components 864 operable to couple the machine 800 to a network 880 or devices 870 via a coupling 882 and a coupling 872, respectively. For example, the communication components 864 may include a network interface component or another suitable device to interface with the network 880. In further examples, the communication components 864 may include wired communication components, wireless communication components, cellular communication components, and other communication components to provide communication via other modalities. The devices 870 may be another machine or any of a wide variety of peripheral devices (e.g., a peripheral device coupled via a universal serial bus (USB)).

EXECUTABLE INSTRUCTIONS AND MACHINE-STORAGE MEDIUM

The various memories (i.e., 830, 832, 834, and/or memory of the processor(s) 810) and/or storage unit 836 may store one or more sets of instructions 816 and data structures (e.g., software) embodying or utilized by any one or more of the methodologies or functions described herein. These instructions 816, when executed by the processor(s) 810, cause various operations to implement the disclosed embodiments.

As used herein, the terms "machine-storage medium," "device-storage medium," and "computer-storage medium" mean the same thing and may be used interchangeably. The terms refer to a single or multiple storage devices and/or media (e.g., a centralized or distributed database, and/or associated caches and servers) that store executable instructions and/or data. The terms shall accordingly be taken to include, but not be limited to, solid-state memories and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "transmission medium" discussed below.

TRANSMISSION MEDIUM

In various example embodiments, one or more portions of the network 880 may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 880 or a portion of the network 880 may include a wireless or cellular network, and the coupling 882 may be a Code Division Multiple Access (CDMA) connection, a Global System for Mobile communications (GSM) connection, or another type of cellular or wireless coupling. In this example, the coupling 882 may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 816 may be transmitted or received over the network 880 using a transmission medium via a network interface device (e.g., a network interface component included in the communication components 864) and utilizing any one of a number of well-known transfer protocols (e.g., hypertext transfer protocol (HTTP)). Similarly, the instructions 816 may be transmitted or received using a transmission medium via the coupling 872 (e.g., a peer-to-peer coupling) to the devices 870. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 816 for execution by the machine 800, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

COMPUTER-READABLE MEDIUM

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
one or more processors; and
a memory storing instructions that, when executed by the one or more processors, cause the system to perform operations comprising:
   causing display, on a display device in communication with the system, of a graphical user interface (GUI) that includes a display of an integrated circuit floor plan comprising a plurality of macro-cells, each macro-cell corresponding to an integrated circuit component;
   receiving, via the GUI, a user selection of two or more macro-cells of the plurality of macro-cells of the integrated circuit floor plan;
   in response to receiving the user selection of the two or more macro-cells, updating the GUI to display one or more layout options for the two or more macro-cells in conjunction with the display of the integrated circuit floor plan, each of the one or more layout options specifying an arrangement of the two or more macro-cells; and
   in response to receiving a user selection of a layout option from the one or more layout options, updating the display of the integrated circuit floor plan, the updating of the display of the integrated circuit floor plan including modifying a placement of the two or more macro-cells in the integrated circuit floor plan in accordance with the selected layout option.

2. The system of claim 1, wherein the updating the GUI to display the one or more layout options for the two or more macro-cells includes causing display of a window in conjunction with the display of the integrated circuit floor plan, the window presenting the one or more layout options.

3. The system of claim 2, wherein the display of the window includes a curve plotted over the one or more layout options, each of the one or more layout options being represented by a point on the curve.

4. The system of claim 3, wherein receiving the user selection of the layout option includes receiving a selection of a point on the curve corresponding to the selected layout option.

5. The system of claim 3, wherein the operations further comprise visually distinguishing the selected layout option from other layout options presented within the window based on user selection of a point on the curve corresponding to the selected layout option.

6. The system of claim 1, wherein the updating the GUI to display the one or more layout options for the two or more macro-cells includes:
 plotting each of the one or more layout options within a coordinate system; and
 plotting a curve within the coordinate system such that the curve intersects a point on each of the one or more layout options.

7. The system of claim 6, wherein the operations further comprise:
 determining a minimum bounding box for each of the one or more layout options;
 identifying a set of points within the coordinate system that includes a corner of each minimum bounding box; and
 performing a curve fitting process on the set of points to determine the curve.

8. The system of claim 1, further comprising determining a plurality of layout options for the two or more macro-cells based on one or more constraints.

9. The system of claim 8, wherein the operations further comprise:
 ranking the plurality of layout options based on satisfaction of the one or more constraints; and
 selecting the one or more layout options from the plurality of layout options based on the ranking.

10. The system of claim 8, wherein the one or more constraints include at least one of a wire length, a timing, and a dead space percentage.

11. The system of claim 8, wherein the operations further comprise causing display, within the GUI, of a constraint selector window that enables a user to specify the one or more constraints.

12. The system of claim 1, wherein each arrangement of the two or more macro-cells includes a position and an orientation for each of the two or more macro-cells.

13. A method comprising:
 causing display, on a display device in communication with a computer system, of a graphical user interface (GUI) that includes a display of an integrated circuit floor plan comprising a plurality of macro-cells, each macro-cell corresponding to an integrated circuit component;
 receiving, via the GUI, a user selection of a group of macro-cells from the plurality of macro-cells of the integrated circuit floor plan;
 updating the GUI to display, in conjunction with the display of the integrated circuit floor plan, a window presenting one or more layout options for the group of macro-cells, each of the one or more layout options specifying an arrangement of the group of macro-cells;
 receiving, via the GUI, a user selection of a layout option from the one or more layout options displayed in conjunction with the display of the integrated circuit floor plan; and
 in response to receiving the user selection of the layout option, updating the display of the integrated circuit floor plan, the updating of the display of the integrated circuit floor plan including modifying a position or orientation of at least one macro-cell in the group of macro-cells in the integrated circuit floor plan in accordance with the selected layout option.

14. The method of claim 13, wherein the window includes a curve plotted over a display of the one or more layout options, each of the one or more layout options having a corresponding point on the curve, the display of the one or more layout options including a first layout option overlaid on a second layout option.

15. The method of claim 14, wherein receiving the user selection of the layout option includes receiving a selection of a point on the curve corresponding to the selected layout option.

16. The method of claim 14, further comprising visually distinguishing the selected layout option from other layout options presented within the window based on user selection of a point on the curve corresponding to the selected layout option.

17. The method of claim 13, wherein the updating the GUI to display the window presenting the one or more layout options for the group of macro-cells includes:
 plotting each of the one or more layout options within a coordinate system; and
 plotting a curve within the coordinate system such that the curve intersects a point on each of the one or more layout options.

18. The method of claim 17, further comprising:
 determining a minimum bounding box for each of the one or more layout options;
 identifying a set of points within the coordinate system that includes a corner from each minimum bounding box; and
 performing a curve fitting process on the set of points to determine the curve.

19. The method of claim 13, further comprising determining the one or more layout options for the group of macro-cells based on one or more constraints, the one or more constraints including at least one of: a wire length, a timing, and a dead space percentage.

20. A non-transitory computer-readable medium storing instructions that, when executed by one or more processors, cause the one or more processors to perform operations comprising:
 causing display, on a display device in communication with a computer system, of a graphical user interface (GUI) that includes a display of an integrated circuit floor plan comprising a plurality of macro-cells;
 receiving, via the GUI, a user selection of a group of macro-cells from the plurality of macro-cells of the integrated circuit floor plan;
 determining a plurality of layout options for the group or more macro-cells based on one or more user constraints, each of the plurality of layout options specifying a location and orientation of each macro-cell in the group of macro-cells;
 updating the GUI to display, in conjunction with the display of the integrated circuit floor plan, a window presenting the plurality of layout options for the group of macro-cells;
 receiving, via the GUI, a user selection of a layout option from the plurality of layout options displayed in conjunction with the display of the integrated circuit floor plan; and
 in response to receiving the user selection of the layout option, updating the display of the integrated circuit floor plan, the updating of the display of the integrated circuit floor plan including modifying a placement of the group of macro-cells in the integrated circuit floor plan in accordance with the selected layout option.

\* \* \* \* \*